United States Patent
Forejt et al.

(10) Patent No.: US 6,788,146 B2
(45) Date of Patent: Sep. 7, 2004

(54) CAPACITOR COMPENSATION IN MILLER COMPENSATED CIRCUITS

(75) Inventors: Brett E. Forejt, Frisco, TX (US); John M. Muza, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 24 days.

(21) Appl. No.: 10/320,123

(22) Filed: Dec. 16, 2002

(65) Prior Publication Data

US 2004/0113696 A1 Jun. 17, 2004

(51) Int. Cl.[7] .............................................. H03F 3/45
(52) U.S. Cl. ................................. 330/257; 330/292
(58) Field of Search ................................ 330/252, 255, 330/257, 260, 292

(56) References Cited

U.S. PATENT DOCUMENTS 6,150,884 A * 11/2000 Fattaruso .................. 330/257
6,542,030 B2 * 4/2003 Huijsing et al. ............ 330/252

OTHER PUBLICATIONS

Gray, Paul R., et al., "Analysis and Design of Analog Integrated Circuits," Third Edition, John Wiley & Sons, Inc. © 1977, 1984, 1993, pp. 607–622.

Rincon–Mora, Gabriel A., "Active Capacitor Multiplier in Miller–Compensated Circuits," *IEEE Transactions on Solid–State Circuits*, vol. 35, No. 1, Jan. 2000, pp. 26–32.

* cited by examiner

*Primary Examiner*—Steven J. Mottola
(74) *Attorney, Agent, or Firm*—J. Dennis Moore; W. James Brady, III; Frederick J. Telecky, Jr.

(57) ABSTRACT

A Miller-compensated amplifier circuit. The circuit includes an amplifier stage, and a compensation capacitor arranged in parallel with the amplifier stage. A current multiplier circuit path, adapted to multiply a current through the compensation capacitor, includes an inversion stage in the current multiplier circuit path. The inversion stage includes a first current mirror adapted to mirror a first current corresponding to a current through the compensation capacitor, to provide a second current, as well as a second current mirror adapted to mirror and invert the second current to provide a third current and to apply the third current to the amplifier stage. In this way, the circuit is Miller compensated by only a single capacitor that has its capacitance multiplied in accordance with current-mode multiplication.

3 Claims, 6 Drawing Sheets

CAPACITOR COMPENSATION IN MILLER COMPENSATED CIRCUITS

TECHNICAL FIELD OF THE INVENTION

This invention relates to frequency compensated electronic circuits, and more particularly relates to amplifier circuits having Miller-compensating capacitors.

BACKGROUND OF THE INVENTION

The stability performance of circuits having feedback is improved by providing compensation so as to increase phase margin. A well known technique for improving phase margin takes advantage of the Miller Effect, by adding a Miller-compensating capacitance in parallel with a gain stage, e.g., the output stage of a two stage amplifier circuit. Such a configuration results in the well-known and desirable phenomenon called pole splitting, which advantageously multiplies the effective capacitance of the physical capacitor employed in the circuit. See, e.g., for background on compensation of amplifier circuits using Miller-compensating capacitance, Paul R. Gray and Robert G. Meyer, Analysis and Design of Analog Integrated Circuits, Third Ed., John Wiley & Sons, Inc., New York, 1993, Ch. 9, pp. 607–623.

However, integrated capacitors occupy a relatively large area on an integrated circuit chip, relative to other components such as complementary-metal-oxide-semiconductor ("CMOS") transistors. The problem becomes worse when the load capacitance seen by a circuit having Miller-compensating capacitance becomes large. This requires the compensating capacitance to increase in value in order to maintain stability. However, the larger compensating capacitance occupies even more physical space. But, this is not a luxury that can be afforded in an environment where more circuits are integrated onto the same die, which, of course, is the trend A current-mode capacitor multiplier technique has been proposed, in an article entitled, "Active Capacitor Multiplier in Miller-Compensated Circuits," by Gabriel A. Rincon-Mora, IEEE JSSC, Vol. 35, No. 1, January 2000, at pages 26–32, by which the size of the Miller capacitor can be reduced by a factor equal to the current gain of a new loop added to the circuit.

FIG. 1 is a circuit diagram of a simple amplifier circuit. This circuit has one dominant pole, in the left hand plane, located at:

$$F_{P1} = \frac{-(g_1 + g_2)}{C_{c1}},\quad \text{Eq. (1)}$$

where $f_{P1}$ is the pole frequency, $f_{O1}$ is the zero frequency, $g_i$ is the conductance (i.e., inverse of output resistance $1/R_0$) of transistor Mi, and $C_{c1}$ is the value of the compensating capacitor.

FIG. 2 is a circuit diagram of a simple amplifier circuit like that of FIG. 1, but modified using the technique described in the Rincon-Mora article. The added current gain loop consisting of current source I and transistor M5 can be seen in the figure. The circuit has one dominant pole and one dominant zero. The pole and the zero are both in the left half plane ("LHP"), and they are located at:

$$f_{P2} = \frac{-gm_5(g_3 + g_2)}{C_{c2}(gm_4 + gm_5)} \quad \text{and} \quad \text{Eq. (2)}$$

$$f_{O2} = \frac{-gm_5}{C_{c2}},\quad \text{Eq. (3)}$$

where $f_{P2}$ is the pole frequency, $f_{O2}$ is the zero frequency, $gm_i$ is the transconductance of transistor Mi, $C_{c2}$ is the value of the compensating capacitor, and other values are as defined above. In this circuit, there is an effective capacitor multiplication of:

$$C_{eq} = C_{c2}\left(1 + \frac{gm_4}{gm_5}\right).\quad \text{Eq. (4)}$$

This is the basic principle of the technique discussed in the Rincon-Mora article.

However, an aspect of the technique discussed in the Rincon-Mora article is that a second capacitor is used to stabilize the amplifier that is discussed in that article, which is more complex than the amplifier discussed above and more typical of amplifiers used in applications such as amplifiers, LDOs and regulators. Another aspect is that the LHP zero reduces the gain margin, and can be a source of long settling time constants. It would therefore be desirable to provide Miller compensation of circuits with capacitor multiplication, but with only a single capacitor. It would also be desirable to provide Miller compensation of circuits with capacitor multiplication, with improved gain margin.

SUMMARY OF THE INVENTION

In accordance with the invention there is provided a Miller-compensated amplifier circuit. The circuit includes an amplifier stage, and a compensation capacitor arranged in parallel with the amplifier stage. A current multiplier circuit path, adapted to multiply a current through the compensation capacitor, includes an inversion stage in the current multiplier circuit path. The inversion staae includes a first current mirror adapted to mirror a first current corresponding to a current throuuh the compensation capacitor, to provide a second current, as well as a second current mirror adapted to mirror and invert the second current to provide a third current and to apply the third current to the amplifier stage. In this way, the circuit is Miller compensated by only a single capacitor that has its capacitance multiplied in accordance with current-mode multiplication. The invention is applicable to single stage amplifiers, as well as multi-stage amplifiers, low drop-outs ("LDOs") and regular circuits, having Miller compensation.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 3:
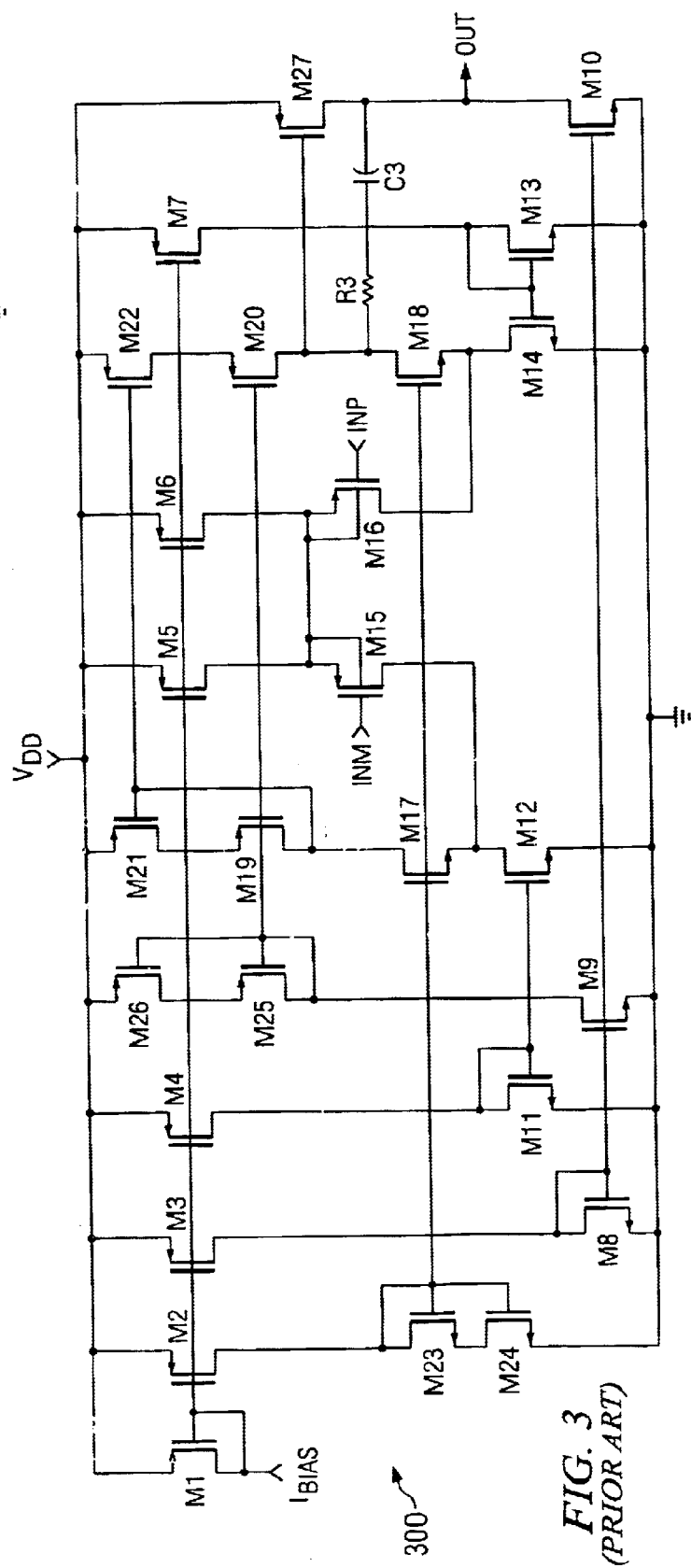
FIG. 3 is a circuit diagram of a first prior art amplifier circuit, having Miller compensation.

In order to more clearly understand the principles applied in constructing the preferred embodiments discussed herein, certain prior art amplifier circuits will now be discussed. FIG. 3 is a circuit diagram of a prior art two-stage, Miller-compensated amplifier circuit 300, having a Class A output stage. In the amplifier, a bias current $I_{BIAS}$ is provided to the drain of a positive-type metal oxide semiconductor ("PMOS") transistor M1, which is mirrored by PMOS transistors M2, M3, M4, M5, M6 and M7, to provide $I_{BIAS}$ currents for sourcing to the circuit. A negative-type metal oxide ("NMOS") semiconductor transistor M8 mirrors $I_{BIAS}$ currents to NMOS transistors M9 and M10, for sinking from the circuit. An NMOS semiconductor transistor M11 also mirrors $I_{BIAS}$ currents, to NMOS transistor M12, for sinking from the circuit, and an NMOS semiconductor transistor M13 also mirrors $I_{BIAS}$ currents, to NMOS transistor M14, for sinking from the circuit.

PMOS transistors M15 and M16 form an input differential pair, receiving differential input voltages INM and INP. PMOS transistors M19, M20, M21 and M22, provide a cascoded current mirror that acts as the differential to single ended converter for the first stage. NMOS transistors M17 and M18, are cascoded devices and serve two purposes: first, they function to increase the gain of the stage, and second, they are required in the "folded cascode" architecture to create the current summing junctions at their sources.

PMOS transistor M27 provides the second, Class A output stage of the amplifier, the output of the amplifier circuit being taken from the drain thereof. Miller compensation is provided by capacitor C3 and resistor R3 connected in series between the output of the amplifier circuit and the signal path connection node between the first stage and the second stage, as shown.

In amplifier circuit 300 of FIG. 3, a typical value for capacitor C3 could be 15 pF, while a typical value for resistor R3 in such a circuit could be 1.4 kΩ. Together, the capacitor and resistor could use 3,500 µm of silicon area, in a 0.18 µm process, using a dense linear capacitor structure and a silicide blocked poly resistor.

Figure 4:
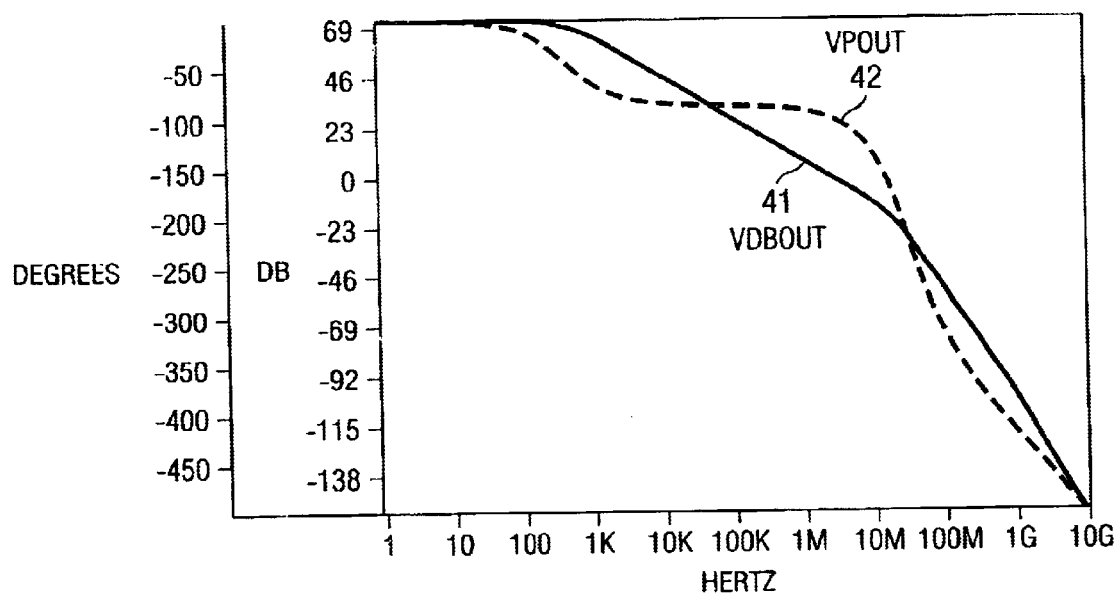
FIG. 4 is a graph of the gain and phase, with frequency, of the amplifier circuit of FIG. 3.

FIG. 4 is a diagram in which two graphs are superimposed, one of phase, in degrees, and the other of gain, in dB, both versus frequency, in Hertz. The gain plot 41 shows the gain of a typical implementation of amplifier 300, having the capacitor and resistor values mentioned in the previous paragraph, while the phase plot 42 shows the output phase for the same amplifier. For the amplifier having the parameters shown in FIG. 4, the unity gain bandwidth ("UGBW") is 2.16 MHz, the phase margin ("PM") is 78° and the gain margin ("GM") is 21 dB.

Figure 5:
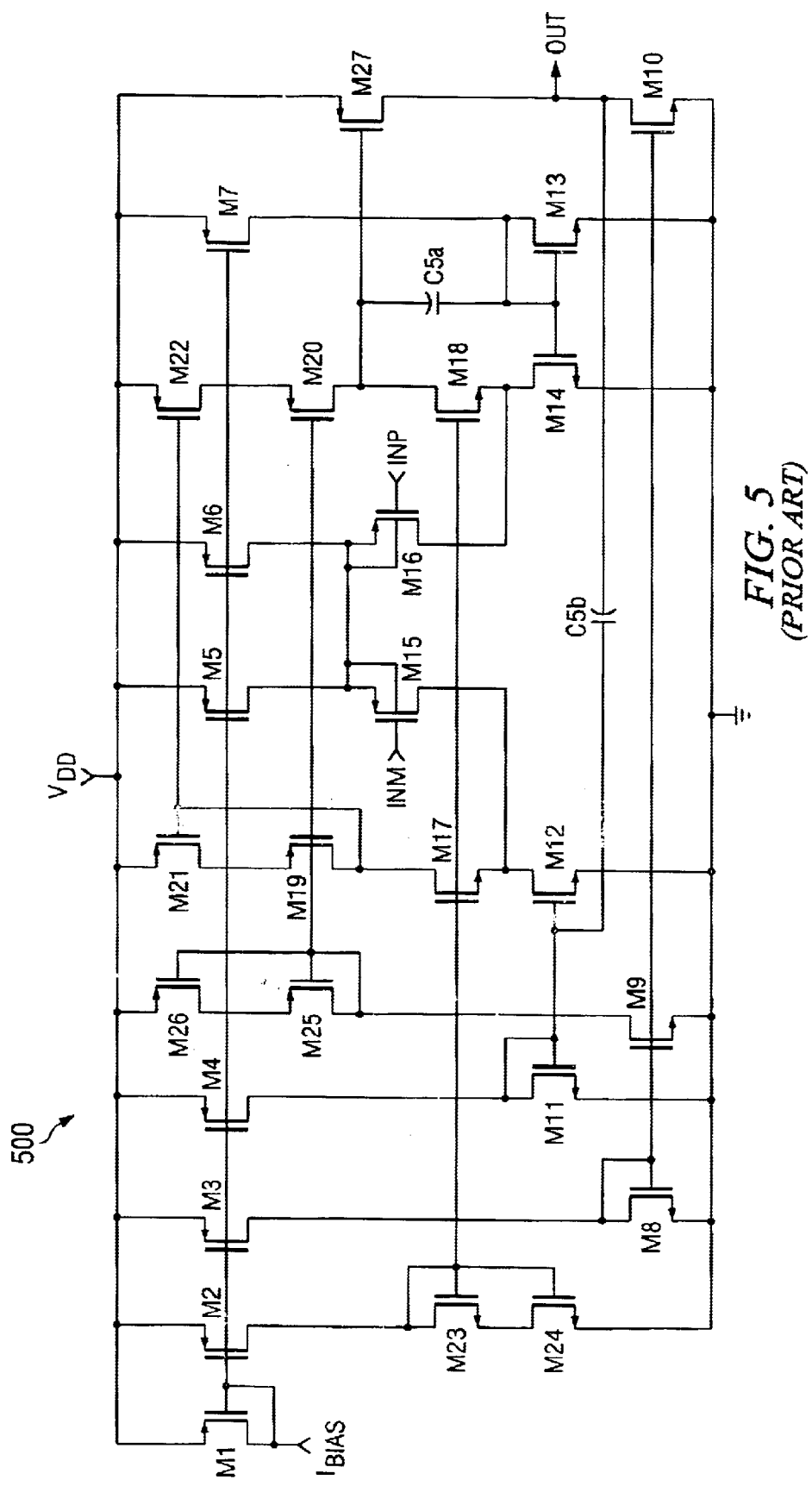
FIG. 5 is a circuit diagram of a second prior art amplifier circuit, having Miller compensation.

FIG. 5 is a circuit diagram of an amplifier 500 like that shown in FIG. 3, but modified in accordance with the technique described in the Rincon-Mora article, mentioned above. Components in FIG. 5 having the same reference labels as those in FIG. 3 function similarly. It can be seen that in FIG. 5, the resistor has been eliminated and two capacitors, C5a and C5b, are now provided. Capacitor C5a is connected between the signal path connection node between the first stage and the second stage, and the common connection node of the gates of transistors M13 and M14. Capacitor C5b is connected between the output node and the output of the amplifier and the common connection node of the gates of transistors M11 and M12. Assuming the common components of the circuits of FIG. 3 and are of the same construction, the sum of the values of capacitors C5a and C5b could be 9.25 pF, which could use 2,100 µm of silicon area in the process mentioned above, again using a dense linear capacitor structure. This is an improvement over the circuit of FIG. 3, but the circuit uses multi-path compensation, and the second path, through capacitor C5b, is not Miller multiplied.

Figure 6:
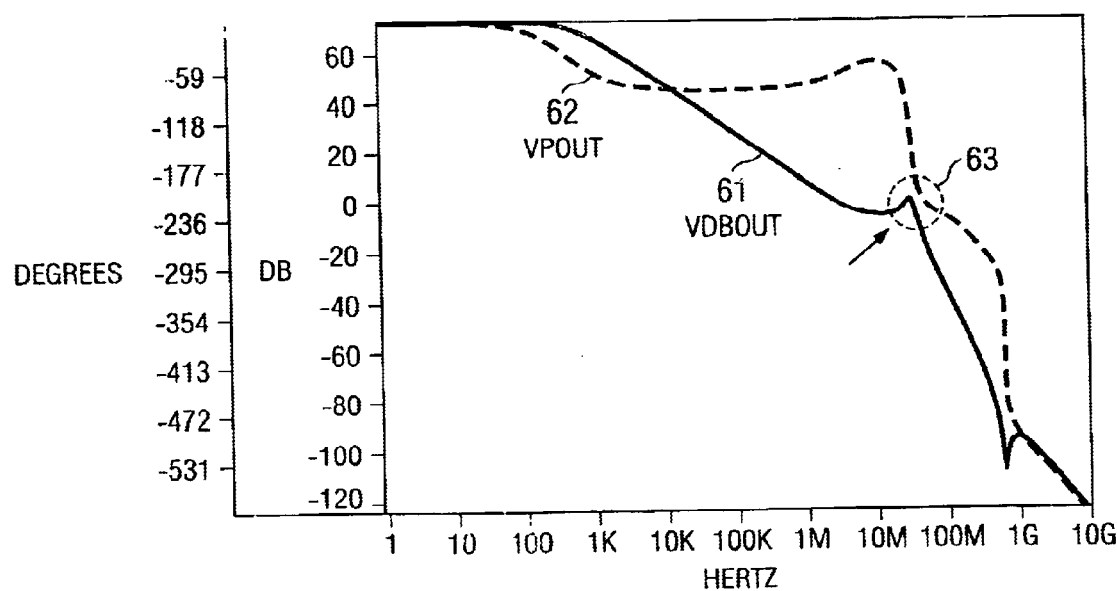
FIG. 6 is a graph of the gain and phase, with frequency, of the amplifier circuit of FIG. 5.

FIG. 6 shows two graphs like those shown in FIG. 4, but for amplifier circuit 500. The effects on the gain 61 and output phase 62 of the LHP zero are shown in circled area 63.

In general, in applying the principles of the present invention, an additional inversion is provided to one of the feedback paths. Specifically, an inversion is provided in a current-mode capacitor multiplier circuit branch that is in parallel with an amplifier stage. This allows the use of only a single capacitor in applying current-mode capacitor multiplication in Miller-compensated circuits. The principles are applicable to single stage amplifier circuits, as well as multi-stage amplifier circuits.

Figure 7:
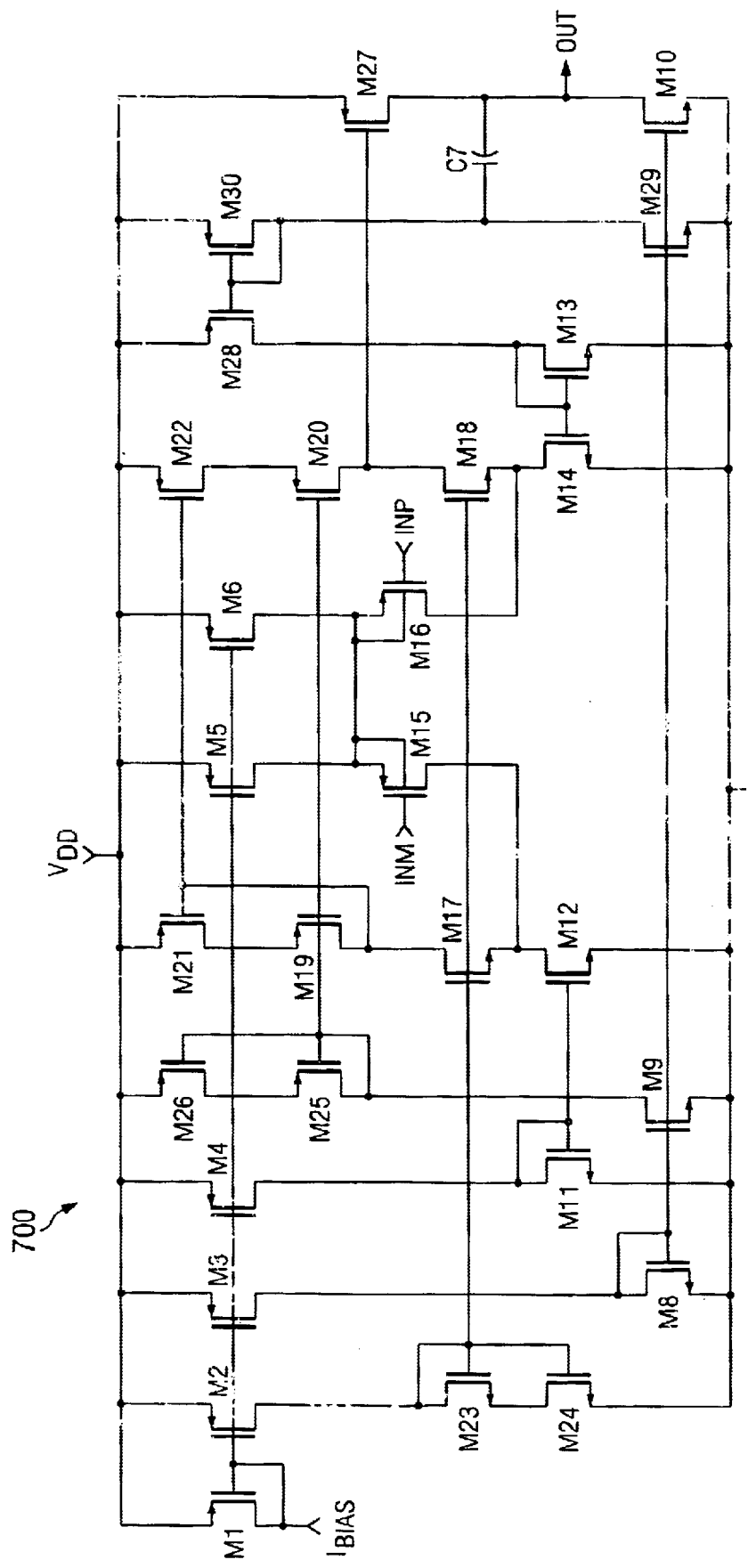
FIG. 7 is a circuit diagram of an amplifier circuit according to a first preferred embodiment of the present invention.

FIG. 7 is a circuit diagram of an amplifier 700 like that shown in FIG. 3, but modified in accordance with the principles of the present invention to provide a first preferred embodiment thereof. In the amplifier 700, only capacitor C7 is required for comparable compensation to that in amplifier 500, and the capacitance of capacitor C7 is both Miller multiplied as well as further multiplied by current-mode capacitor multiplication. Components in FIG. 7 having the same reference labels as those in FIG. 5 function similarly. It can be seen that in FIG. 7, PMOS transistor M28 replaces transistor M7. However, transistor M28 does not have its gate connected to the gate of transistor M1, but, rather, additional NMOS transistor 29 and additional PMOS transistor M30 are provided, with transistors M28 and M30 having their gates connected together and to the drain of transistor M30, with transistor M29 configured to mirror the $I_{BIAS}$ current in transistor M8 for sinking from transistor M30. The compensation capacitor C7 is connected between the output of the amplifier circuit 700 and the common connection node of transistors M29 and M30. Thus, an additional inversion has been provided, in the feedback path from the output of the amplifier circuit 700 through transistors M30, M28, M13, M14, M18, and M27, which includes the compensation capacitor C7. In other words, an inversion is provided in a current-mode capacitor multiplier circuit branch that is in parallel with an amplifier stage. Note that transistors M28, M29, and M30, can be minimally sized and use minimal current, so this technique is readily useable in low power circuit applications. For example, a total additional current from such an added inversion circuit branch of, say, ten µA, or lower, is readily achievable in integrated circuit processes in use today.

Figure 8:
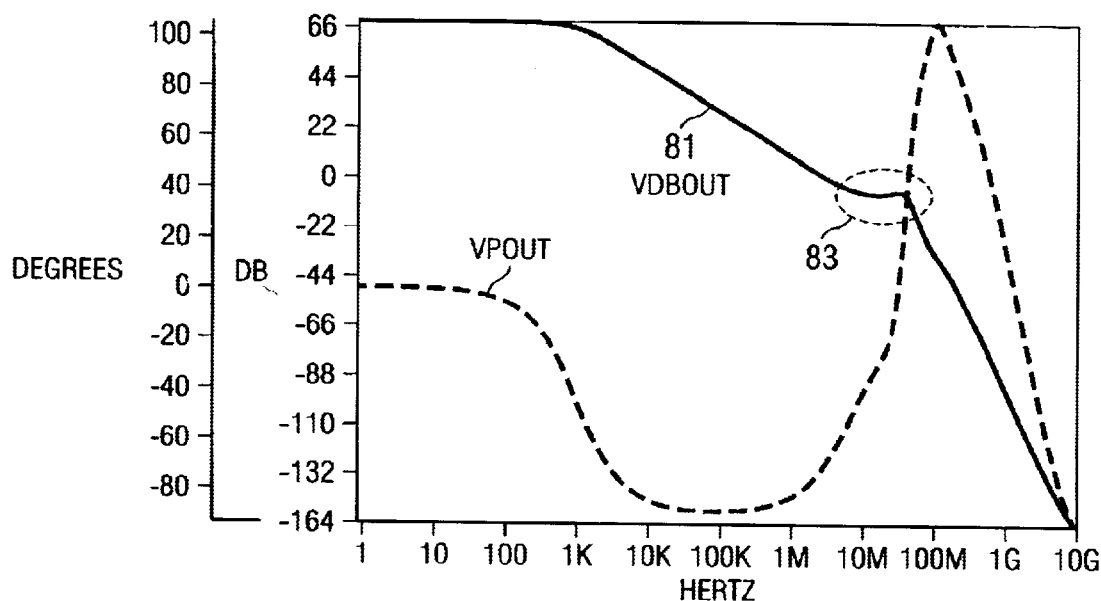
FIG. 8 is a graph of the gain and phase, with frequency, of the amplifier circuit of FIG. 7.

FIG. 8 shows two graphs like those shown in FIG. 4, but for amplifier circuit 700. The effect on the gain 81 (and output phase 82) of the LHP zero is shown in circled area 83. It can be seen that the LHP zero still reduces the gain margin of the circuit, as it does in amplifier circuit 500.

Assuming the common components of the circuits of FIGS. 5 and 7 are of the same construction, the value of capacitor C7 could be 1.25 pF, which could use merely 300 µm of silicon area in the process mentioned above, again using a dense linear capacitor structure. This is a considerable improvement over the circuit of FIG. 5, since the additional silicon area required by transistors M29 and M30 is much less than the reduction in silicon area required for compensation capacitors, as compared with amplifier 500.

Figure 1:
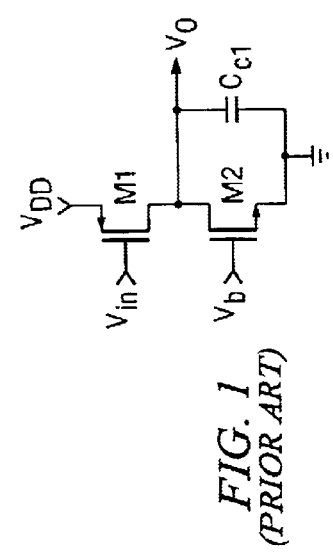
FIG. 1 is a circuit diagram of a first prior art compensation circuit.
Figure 2:
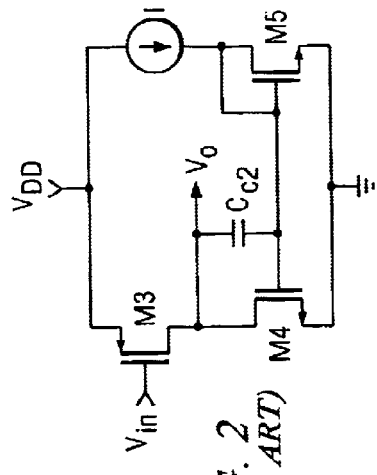
FIG. 2 is a circuit diagram of a second prior art compensation circuit.

To further improve the performance of amplifiers constructed in accordance with the inventive principles, especially in high precision applications at high frequencies, it is desirable that the LHP zero of such circuits be placed at a sufficiently high frequency. In accordance with a further preferred embodiment of the present invention, the transconductance, gm, of the current gain path of the amplifier circuit is increased. Recall from Equation (3) that, for the example discussed in connection with FIG. 2, the frequency of the LHP zero, $f_{o2}$, is $-gm_5/C_{c2}$. For amplifier circuit 700, the frequency, $f_{o7}$, of the LHP zero is:

$$f_{o7} = \frac{gm_{M13}\left(\frac{gm_{M30}}{gm_{M28}}\right)}{C7},$$ Eq. (5)

where $gm_{Mi}$ is the transconductance of transistor Mi in FIG. 7, and C7 is the value of capacitor C7.

Figure 9:
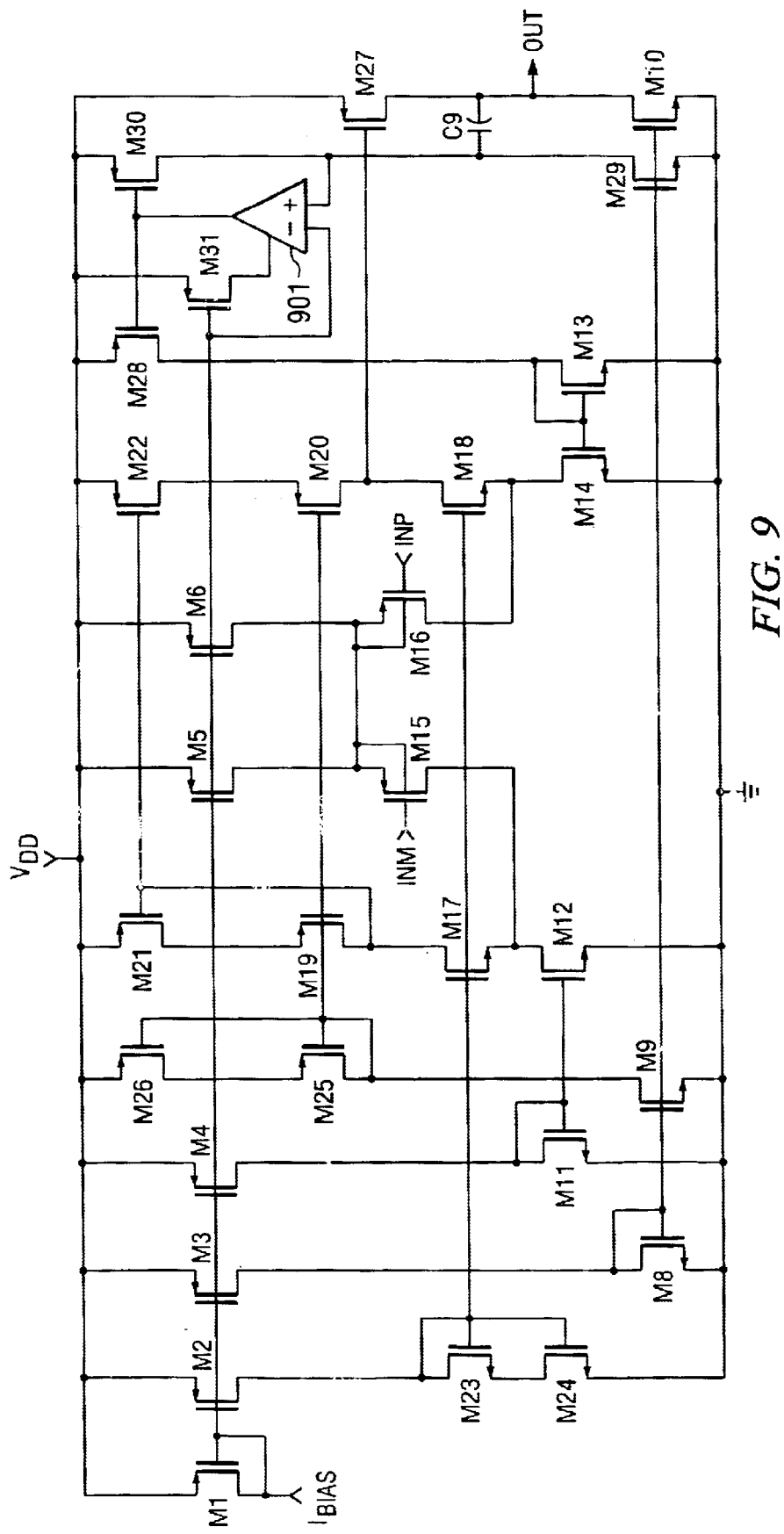
FIG. 9 is a is a circuit diagram of an amplifier circuit according to a second preferred embodiment of the present invention.

Now, the transconductance value of transistor M13 can be increased using conventional techniques, i.e., by increasing power and/or area. However, a more elegant way of increasing the frequency of the LHP zero will now be described. FIG. 9 is a circuit diagram of an amplifier 900 like that shown in FIG. 7, but showing a second preferred embodiment of the present invention. Components in FIG. 9 having the same reference labels as those in FIG. 7 function similarly. In amplifier circuit 900, compared with amplifier circuit 700, it can be seen that a small amplifier 901 has been added, having a non-inverting input connected to the common node of transistors M29 and M30, and having an inverting input connected to the gate of transistor M1. An additional PMOS transistor M31 is also provided, having its gate connected to the gate of transistor M1, to source a current bias of $I_{BIAS}$ to amplifier 901. Here again, amplifier 901 can be very small (e.g., <200 µm²) and be designed to draw very little current (e.g., <50 µA), in integrated circuit processes in use today. The function of amplifier 901 is to allow transistors M28 and M30 to operate as a current mirror, while increasing the transconductance of transistor M30. From Equation (5), it can be seen that this moves the LHP zero to a higher frequency.

Figure 10:
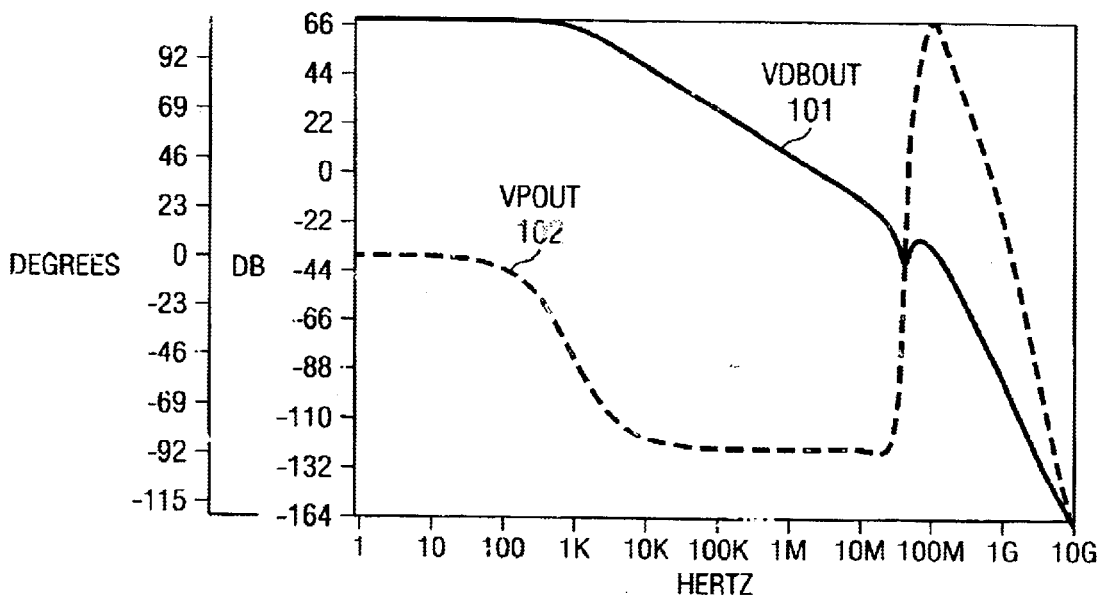
FIG. 10 is a graph of the gain and phase, with frequency, of the amplifier circuit of FIG. 9.

The effect of amplifier 901 on the transconductance $gm_{M30}$ of transistor M30 is to increase it by the open loop gain of the amplifier, causing the desired effect. The frequency $f_{o9}$ of the resulting LHP zero is:

$$f_{o9} = \left(\frac{-gm_{M13}}{C9}\right)\cdot\left(\frac{gm_{M30}\cdot A_{AMP}}{gm_{M28}}\right),$$ Eq. (6)

where C9 is the value of capacitor C9, and $A_{AMP}$ is the voltage gain of amplifier 901. FIG. 10 shows two graphs like those shown in FIG. 8, but for amplifier circuit 900, in which the components in FIG. 9 having the same reference labels as those in FIG. 7 are of the same construction as those in FIG. 7, and in which the gain A of amplifier 901 is approximately 40 dB. The gain is represented by curve 101 and the output phase by curve 102. It can be seen that the frequency $f_{o9}$ of the LHP zero is significantly increased, due to the multiplying factor of the gain of amplifier 901, as shown in Equation (6). In addition, the unity gain bandwidth is approximately 2.8 MHz, while the phase margin is approximately 90°, with a gain margin <−100 dB.

Figure 11:
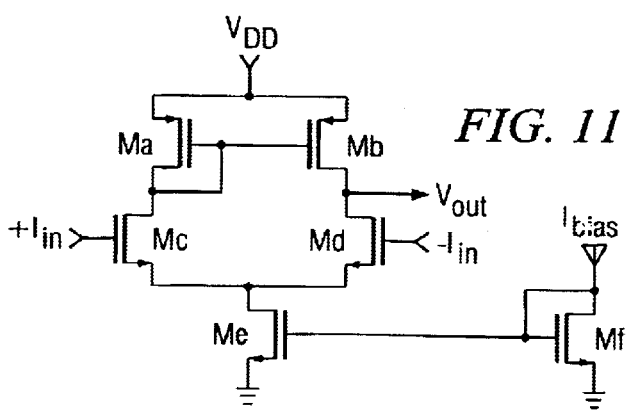
FIG. 11 is a circuit diagram of a preferred design for amplifier 901 of FIG. 9.

The amplifier 901 can be of any conventional construction, but preferably is a single-stage, high bandwidth design. FIG. 11 is a circuit diagram of a preferred design for amplifier 901, comprising transistors Ma through Mf. While preferred in this embodiment, it can be seen that amplifier 901 is of conventional design. In the process mentioned above, using very small devices and approximately 50 µA of current, such an amplifier can be made to occupy approximately 105 µm².

In conclusion, embodiments of the present invention have been shown for use in connection with Miller compensated circuits, in which the value of a Miller-compensating capacitor is not only Miller multiplied, but further multiplied, as well, but only using a single compensating capacitor. Significant improvements over the prior art in use of silicon area are possible, while providing comparable, or even improved performance. Significant improvements in high frequency performance are possible in some embodiments, requiring the additional consumption of only a small current, which can be of the order of tens of ramps.

Although the present invention and its advantages have been described in detail, it should be understood that various changes, substitutions and alterations can be made herein without departing from the spirit and scope of the invention as defined by the appended claims.

What is claimed is:

1. An operational amplifier circuit; comprising:
   a first amplifier stage;
   a second amplifier stage;
   a compensation capacitor arranged in parallel with the second amplifier stage;
   a current multiplier circuit path, adapted to multiply a current through the compensation capacitor; and
   an inversion stage in the current multiplier circuit path, comprising
      a first current mirror adapted to mirror a first current corresponding to a current through the compensation capacitor, to provide a second current; and
      a second current mirror adapted to mirror and invert the second current to provide a third current and to apply the third current to the amplifier stage.

2. An operational amplifier according to claim 1, further comprising an amplifier adapted to increase the transconductance of the first current mirror, to thereby increase the frequency of a left half plane zero of the operational amplifier circuit.

3. An operational amplifier circuit, comprising:

an amplifier stage;

a compensation capacitor arranged in parallel with the amplifier stage;

a current multiplier circuit path, adapted to multiply a current through the compensation capacitor; and an inversion stage in the current multiplier circuit path, comprising a first current mirror adapted to mirror a first current corresponding to a current through the compensation capacitor, to provide a second current; and a second current mirror adapted to mirror and invert the second current to provide a third current and to apply the third current to the amplifier stage.

* * * * *